United States Patent [19]

Imaoka

[11] Patent Number: 4,801,559
[45] Date of Patent: Jan. 31, 1989

[54] PROCESS FOR FORMING PLANAR WIRING USING POLYSILICON TO FILL GAPS

[75] Inventor: Kazunori Imaoka, Komae, Japan

[73] Assignee: Fujitsu Limited, Kawasaki, Japan

[21] Appl. No.: 165,367

[22] Filed: Feb. 29, 1988

Related U.S. Application Data

[60] Continuation of Ser. No. 817,175, Jan. 9, 1986, abandoned, Division of Ser. No. 734,256, May 15, 1985, abandoned, which is a continuation of Ser. No. 400,012, Jul. 20, 1982, abandoned.

[30] Foreign Application Priority Data

Jul. 21, 1981 [JP]  Japan ............................... 56-114716

[51] Int. Cl.$^4$ ........................................... H01L 21/283
[52] U.S. Cl. .................................... 437/193; 437/192;
                                            437/200; 357/71
[58] Field of Search ............... 437/193, 192, 200, 201;
                                            357/67.71; 156/643

[56] References Cited

U.S. PATENT DOCUMENTS

| | | | |
|---|---|---|---|
| 3,946,476 | 3/1976 | Sanders | 357/71 |
| 4,017,886 | 4/1977 | Tomono et al. | 357/71 |
| 4,109,372 | 8/1978 | Geffken | 357/67 S |
| 4,163,246 | 7/1979 | Aomura et al. | |
| 4,164,461 | 8/1979 | Schilling | |
| 4,271,424 | 6/1981 | Inayoshi et al. | 357/71 P |
| 4,291,322 | 9/1981 | Clemens et al. | 357/71 |

FOREIGN PATENT DOCUMENTS

| | | | |
|---|---|---|---|
| 1806980 | of 0000 | Fed. Rep. of Germany | |
| 52-2166 | 1/1977 | Japan | 357/71 S |
| 0028868 | 3/1977 | Japan | |
| 53-17393 | 6/1978 | Japan | 357/71 S |
| 0085042 | 6/1980 | Japan | |
| 0032151 | 2/1984 | Japan | |

OTHER PUBLICATIONS

F. Barson, "Modified polysilicon emitter process," *IBM Technical Disclosure Bulletin*, vol. 22 (1980) pp. 4052–4053.

IBM Technical Disclosure Bulletin, "Dual Insulators for Planar Multilevel Interconnections", Gniewek et al., vol. 21, No. 3, Aug. 1978, pp. 1052–1053.

*Primary Examiner*—Brian E. Hearn
*Assistant Examiner*—T. N. Quach
*Attorney, Agent, or Firm*—Staas & Halsey

[57] ABSTRACT

A semiconductor device having a conductor line free of cracks is produced by forming an insulating layer on a semiconductor substrate, opening a contact hole in the insulating layer, forming a contact electrode comprising a high-melting point metal or a silicide of a high-melting point in the contact hole, filling a gap between the contact electrode and the side of the contact hole with polycrystalline silicon to form a substantially level surface, forming a conductor line on the level surface, and alloying the polycrystalline silicon with the conductor line and/or the contact electrode by heating.

5 Claims, 3 Drawing Sheets

PROCESS FOR FORMING PLANAR WIRING USING POLYSILICON TO FILL GAPS

This is a continuation of co-pending application Ser. No. 817,175 filed on Jan. 9, 1986 which is a division of application Ser. No. 734,250 filed May 15, 1985, which is a continuation of application Ser. No. 400,012 filed July 20, 1982 all of these applications now abandoned.

BACKGROUND OF THE INVENTION

1. Field of the Invention

The present invention relates to a semiconductor device and a method for producing the same. More particularly, it relates to an interconnection structure in a semiconductor device, such as an integrated circuit (IC) device or a large-scale integration (LSI) device.

2. Description of the Prior Art

In order to make a semiconductor device (an IC or LSI device) denser, active elements (e.g., transistors) and passive elements (e.g., resistors and condensers) in the semiconductor device are made smaller, and the conductor pattern for electrically interconnecting the elements is made finer. The conductor pattern comprises conductor lines (i.e., wirings) formed on an insulating layer of, e.g, phosphosilicates glass (PSG) or silicon dioxide ($SiO_2$) and making contact through small apertures (i.e., contact holes) in the insulating layer with the underlying device portion (e.g., a portion of the semiconductor substrate) or with an underlying conductor line.

In a case where a conductive layer (e.g., an aluminum layer) is formed by a vacuum evaporation method and is photoengraved to form a conductor pattern, i.e. a desired pattern of conductor lines, cracks form in the conductor line at the contact hole edge, and, as a result, breakage or disconnection of the conductor line can occur or the resistance value of the conductor line can increase.

In order to form a conductor line without the above-mentioned disadvantage, it is attempted to round a relatively sharp edge of the contact hole by heating the insulating layer, comprising, e.g., PSG, to its softening point. In the case, however, this heat treatment causes impurities doped in the diffused region of the semiconductor substrate to diffuse, and, thereby, the diffused region expands undesirably. It is also attempted to deposit conductive material (i.e., a contact electrode) in the contact hole only and then form the conductor line on the contact electrode and the insulating layer. In the latter attempt, as illustrated in FIG. 1, an insulating layer 1 (e.g., PSG) formed on a semiconductor substrate 2 (e.g., a silicon wafer) is selectively etched by a conventional photoetching method using a photoresist layer 3 to form a contact hole 4. As illustrated in FIG. 2, a conductive material (e.g., aluminum) is deposited on the photoresist layer 3 and the exposed surface of the substrate 2 by a vacuum evaporation method to form a contact electrode 5a and a conductive layer 5b. Then, as illustrated in FIG. 3, a photoresist layer 3 and a conductive layer 5b are simultaneously removed with a suitable solvent. This removal process is referred to as the lift off process. A wedge-shaped gap 6 (FIG. 3) is formed between the contact electode 5a and the side of insulating layer 1. As illustrated in FIG. 4, when a conductive material (e.g., aluminum) is deposited on insulating layer 1 and on contact electrode 5a by a vapor evaporation method to form a conductor layer 7, cracks 8 form in the conductor layer 7 depending on the circumstances. Accordingly, the conductor layer 7, having cracks, is patterned by a photoetching method to form a conductor line 7 having a defect, such as a break or a thin portion. In this case, the possibility of the occurrence of breaks is not as great as in the case where a conductor line is formed without using a contact electrode.

SUMMARY OF THE INVENTION

An object of the present invention is to form a conductor line without a break or a thin portion.

Another object of the present invention is to provide an interconnection structure comprising a good conductor line and a method for producing the same.

The above and other objects of the present invention are attained by providing a semiconductor device which is produced by the steps of: forming an insulating layer on a semiconductor substrate having a contact hole therein; forming a contact electrode in the contact hole; filling a gap formed between the contact electrode and the side of the contact hole with polycrystalline silicon to form a level surface of the insulating layer, the contact electrode, and the polycrystalline silicon; forming a conductor line on the level surface; and alloying the polycrystalline silicon with material of the conductor line and/or the contact electrode by heating.

The invention will become more apparent from the description of the preferred embodiments set forth below, with reference to the accompanying drawings.

DESCRIPTION OF THE PREFERRED EMBODIMENTS

Figure 1:
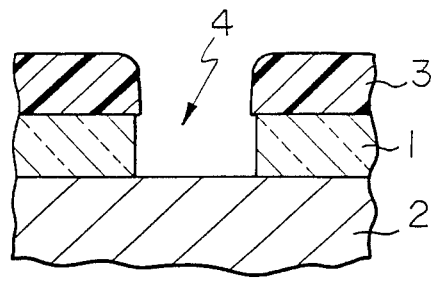
FIGS. 1 through 4 are partial cross-sectional views of a semiconductor device in various stages of production in accordance with prior art techniques.
Figure 2:
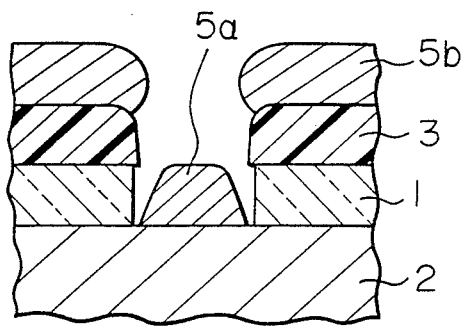
Figure 3:
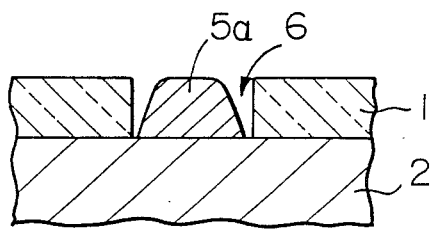
Figure 4:
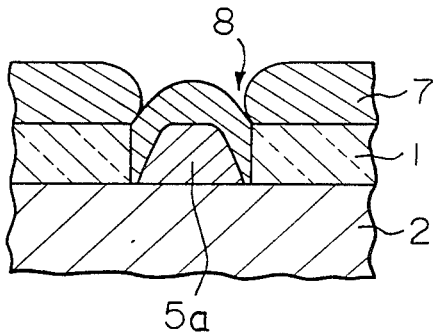
Figure 5:
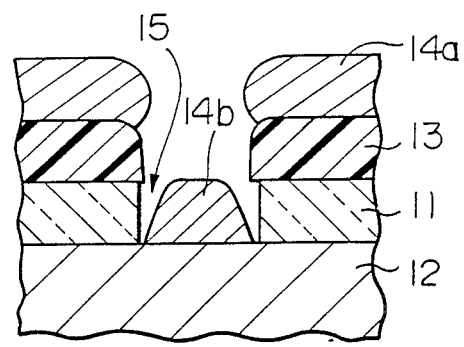
FIGS. 5 through 8 are partial cross-sectional views of a semiconductor device in various stages of production in accordance with a first embodiment of the present invention.

Referring to FIGS. 5 through 8, a process for producing a semiconductor device including an interconnection structure in accordance with the first embodiment of the present invention will now be explained. As illustrated in FIG. 5, an insulating layer 11 (e.g., PSG or $SiO_2$) is formed on a semiconductor substrate 12 (e.g., a silicon wafer). A photoresist layer 13 is coated on the insulating layer 11, exposed and developed, to form a photoresist pattern having a through hole. The insulating layer 11 is selectively etched with a suitable etchant through the through hole to form a contact hole (i.e., a through aperture). Then a high-melting point metal, such as molybdenum (Mo), tantalum (Ta), titanium (Ti), tungsten (W), or platinum (Pt), is deposited on the photoresist layer 13 and on the exposed portion of the semiconductor substrate 12 by a sputtering method to form a metal layer 14a and a contact electrode 14b. It is possible to use a silicide of one of the above-mentioned metals (MoSi$_2$, TaSi$_2$, TiSi, WSi$_2$, and Pt$_2$Si) instead of a high-melting point metal. It is preferble to make the thickness of the metal layer 14a equal to that of the insulating layer 11. The contact electrode 14b is positioned within the contact hole of the insulating layer 11, and a wedge-shaped gap 15 is formed between the contact electrode 14b and the side of the insulating layer 11.

Figure 6:
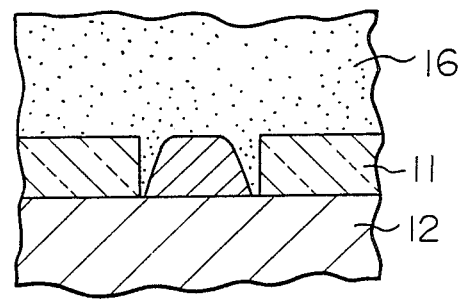

The photoresist layer 13 is removed with a suitable solvent, and, therefore, the metal layer 14a is removed. Then, as illustrated in FIG. 6, polycrystalline silicon is deposited on the surfaces of the insulating layer 11 and contact electrode 14b by a low-pressure chemical vapor deposition (CVD) method to form a polycrystalline silicon layer 16. In this case, the thermal decomposition of silane (SiH$_4$) or the reduction of SiCl$_4$ (or SiH$_2$Cl$_2$) with hydrogen is carried out at a reaction temperature of 600° C. to 700° C. so that it is impossible to use aluminum (Al) for the contact electrode 14b. Moreover, the wedge-shaped gap 15 can be completely filled with the polycrystalline silicon.

Figure 7:
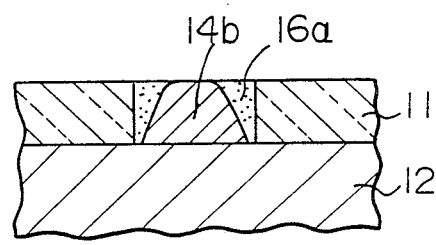

The polycrystalline silicon layer 16 is etched to expose the surface of insulating layer 11 by a dry etching method, such as a reactive sputter etching method, as illustrated in FIG. 7. If the thickness of the contact electrode 14b is equal to that of the insulating layer 11, the surface of the contact electrode 14b is also exposed. The wedge-shaped polycrystalline silicon portion 16a remains in the wedge-shaped gap so that a substantially level surface of the entire layer comprising the insulating layer 11, contact electrode 14b, and wedge polycrystalline silicon portion 16a can be obtained.

Figure 8:
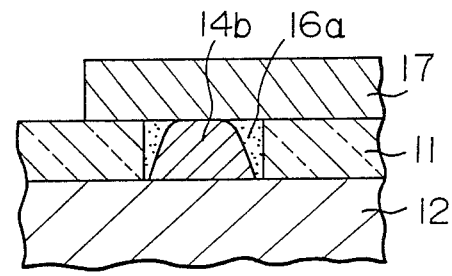

Then, as illustrated in FIG. 8, Al is deposited on the level surface (i.e., on the surface of the insulating layer 11, the wedge-shaped polycrystalline silicon portion 16a, and the contact electrode 14b) by a vacuum evaporation method to form a conductor layer 17 without causing cracks to form. The conductor (Al) layer 17 is selectively etched by a conventional photoetching method to form a conductor line 17 for interconnection. It is possible to use one of the above-mentioned high-melting point metals, such as Mo, Ta, Ti, W, or Pt, instead of Al. In this case, the conductor layer 17 is formed by sputtering the high-melting point metal. The resultant device is heated so as to alloy the wedge-shaped polycrystalline silicon portion 16a with the conductor line 17 and/or contact electrode 14b. The heating temperature is approximately 400° C. to 500° C. in the case of the Al conductor line and is from 900° C. to 1000° C. in the case of the high-melting point conductor line. Contact electrode 14b and the alloy of the polycrystalline silicon portion 16a ensure an ohmic contact between the conductor line 17 and the semiconductor substrate 12. Thus, a semiconductor device having a conductor line free of cracks is produced.

In the case of the Al conductor line, if a PSG layer is formed on the conductor line 17 and the insulating layer 11 as a passivation film, the alloying is carried out during the formation of PSG by the CVD method.

Figure 9:
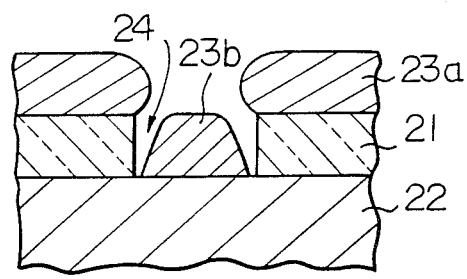
FIGS. 9 and 10 are partial cross-sectional views of a semiconductor device in various stages of production in accordance with second embodiment of the present invention.

It is possible to produce a semiconductor device in accordance with the second embodiment of the present invention. This process of production will now be explained, referring to FIGS. 9 and 10. In FIG. 9, contact hole is formed in the insulating layer 21 on the semiconductor substrate 22 in the same manner as that of the first embodiment. The photoresist layer (not shown) on the insulating layer 21 is removed with a suitable solvent. One of the above-mentioned high-melting point metals is deposited, on the insulating layer 21 and on the exposed portion of the semiconductor substrate 22, by a sputtering method to form a metal layer 23a and a contact electrode 23b, respectively. A wedge-shaped gap 24 is formed between the contact electrode 23b and the side of insulating layer 21.

Figure 10:
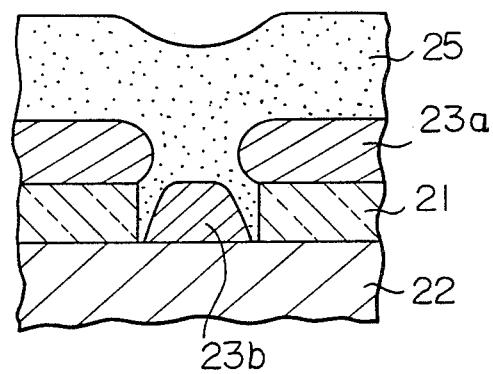

As illustrated in FIG. 10, polycrystalline silicon is deposited on the surfaces of the metal layer 23a and the contact electrode 23b by a low-pressure CVD method to form a polycrystalline silicon layer 25. The wedge-shaped gap is filled with the polycrystalline silicon layer 25. Then the polycrystalline silicon layer 25 and the metal layer 23a are etched by a dry etching method so as to expose the surface of the insulating layer 21. Thus, the obtained structure, having a level surface, is the same as that illustrated in FIG. 7.

A conductor line of Al or of one of the above-mentioned high-melting point metals is formed and then a heat treatment for alloying the portion of polycrystalline silicon layer 25 remaining in the wedge gap with the conductor line and/or contact electrode 23b is carried out in the same manner as that of the first embodiment. As a result, it is possible to produce a semiconductor device having a conductor line free of cracks, the structure of the device being the same as that illustrated in FIG. 8.

Figure 11:
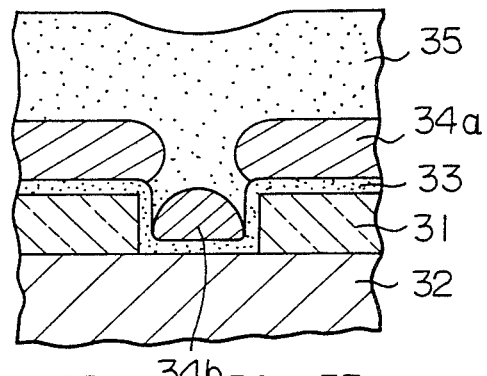
FIGS. 11 and 12 are partial cross-sectional views of a semiconductor device in various stages of production in accordance with a third embodiment of the present invention.

It is also possible to produce a semiconductor device in accordance with the third embodiment of the present invention. This process of production will be explained referring to FIGS. 11 and 12. In FIG. 11, a contact hole is formed in an insulating layer 31 on the semiconductor substrate 32 in the same manner as that of the first embodiment. The photoresist layer (not shown) on the insulating layer 31 is removed with a suitable solvent. A thin polycrystalline silicon layer 33 is formed on the exposed surfaces of the insulating layer 31 and the semiconductor substrate 32 by a low-pressure CVD method. Preferably, the polycrystalline silicon layer 33 is heavily doped by means of a thermal impurity diffusion or an ion implantation after the deposition. Then one of the above-mentioned high-melting point metals is deposited on the thin polycrystalline silicon layer 33 by a sputtering method so that a metal layer 34a and a contact electrode 34b are formed. The contact electrode 34b is positioned within a blind hole of thin silicon layer 33, and a wedge-shaped gap is formed between the contact electrode 34b and the vertical surface of the thin silicon layer 33. For example, the thicknesses of the insulating layer 31, the thin polycrystalline silicon layer 33, and the metal layer 34a are approximately 800 nm, approximately 100 nm, and from 400 to 700 nm, respectively. Polycrystalline silicon is deposited on the entire exposed surface by a low-pressure CVD method to form polycrystalline silicon layer 35, with which the wedge-shaped gap is filled.

Figure 12:
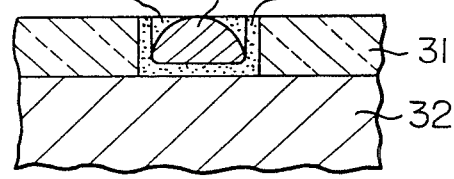

Then, as illustrated in FIG. 12, the polycrystalline silicon layer 35, the metal layer 34a, and the thin polycrystalline silicon layer 33 are etched by a dry etching method so as to expose the surface of the insulating layer 31. Portion 35a of the silicon layer 35 remains in the wedge-shaped gap.

A conductor line (not shown) comprising a high-melting point metal is formed by using a sputtering method and a photoetching method and then a heat treatment for alloying the polycrystalline silicon of the wedge-shaped portion 35a and the remaining thin layer 33 with the high-melting point metal of the conductor line and the contact electrode 34b, is carried out in the same manner as that of the first embodiment.

In a case where a conductor line is made of Al, it is preferable to perform a heat treatment for alloying the polycrystalline silicon of wedge-shaped portion 35a and the thin layer 33 with the contact electrode 34b prior to the formation of the Al conductor line. The heat-treatment conditions are, for example, a heating temperature of 1000° C. and a heating time of ten minutes. After the formation of the Al conductor line, the Al conductive line is subjected to a heat treatment (annealing) at approximately 400° C. to 500° C.

Thus, it is possible to produce a semiconductor device having a conductor line free of cracks since the wedge-shaped polycrystalline silicon portion ensures the formation of a substantially level surface, as illustrated in FIG. 12.

It will be obvious that the present invention is not restricted to the above-mentioned embodiments and that many variations are possible for persons skilled in the art without departing from the scope of the invention. For example, a contact electrode is arranged on another conductor line instead of a semiconductor substrate.

I claim:

1. A method for producing a semiconductor device having a semiconductor substrate, comprising the steps of:
    (a) forming an insulating layer on the semiconductor substrate;
    (b) forming a contact hole in the insulating layer;
    (c) depositing a metal layer over the entire surface of the device and in the contact hole, a portion of the metal layer in the contact hole forming a contact electrode positioned such that a gap is formed between the contact electrode and the sides of the contact hole in the insulating layer;
    (d) removing the metal layer except for the contact electrode;
    (e) depositing polycrystalline silicon over the entire surface of the device to form a polycrystalline silicon layer including a wedge-shaped portion in the gap;
    (f) etching the polycrystalline silicon layer so that a level surface is formed by the insulating layer, wedge-shaped portion and contact electrode;
    (g) forming a conductor line on the level surface of the contact electrode, the polycrystalline silicon, and the insulating layer; and
    (h) heating and alloying the polycrystalline silicon with the conductor line and the contact electrode.

2. A method for producing a semiconductor device according to claim 1, wherein said step (c) of depositing a metal layer comprises selecting a material from the group consisting of molybdenum, tantalum, titanium, tungsten, platinum, and silicides thereof.

3. A method for producing a semiconductor device according to claim 1, wherein said step (g) of forming the conductor line comprises selecting a metal from the group consisting of aluminum, molybdenum, tantalum, titanium, tungsten and platinum.

4. A method for producing a semiconductor device having a semiconductor substrate, comprising the steps of:
    (a) forming an insulating layer on the semiconductor substrate;
    (b) selectively etching the insulating layer and forming a contact hole therein;
    (c) depositing a metal layer on the insulating layer and in the contact hole, a portion of the metal layer in the contact hole forming a contact electrode positioned in such a way that a wedge-shaped gap is formed between the contact electrode and the sides of the contact hole in the insulating layer;
    (d) depositing polycrystalline silicon over the entire surface of the device to form a polycrystalline silicon layer including a wedge-shaped portion in the wedge-shaped gap;
    (e) etching the polycrystalline silicon layer and the metal layer to form a level surface of the insulating layer, wedge-shaped portion and contact electrode;
    (f) forming a conductor line on the level surface of the insulating layer, the wedge-shaped portion and the contact electrode; and
    (g) alloying the polycrystalline silicon layer with the conductor line and the contact electrode.

5. A method for producing a semiconductor device having a semiconductor substrate, comprising the steps of:
    (a) forming an insulating layer on the semiconductor substrate;
    (b) selectively etching the insulating layer and forming a contact hole therein;
    (c) forming a thin polycrystalline silicon layer on the insulating layer and in the contact hole;
    (d) depositing a metal over the thin polycrystalline silicon layer, a portion of the metal layer in the contact hole forming a contact electrode positioned in such a way that a wedge-shaped gap is formed between the contact electrode and the thin polycrystalline silicon layer;
    (e) depositing polycrystalline silicon on the entire surface to form a polycrystalline silicon layer including a wedge-shaped portion in the wedge-shaped gap;
    (f) etching the polycrystalline silicon layer, the metal layer, and the thin polycrystalline silicon layer to form a level surface of the insulating layer, the wedge-shaped portion and the contact electrode;
    (g) forming a conductor line on the level surface of the insulating layer, the wedge-shaped portion and the contact electrode; and
    (h) alloying the polycrystalline silicon layer with the conductor line and the contact electrode.

* * * * *

UNITED STATES PATENT AND TRADEMARK OFFICE
CERTIFICATE OF CORRECTION

PATENT NO. : 4,801,559
DATED : JANUARY 31, 1989
INVENTOR(S) : KAZUNORI IMAOKA

It is certified that error appears in the above-identified patent and that said Letters Patent is hereby corrected as shown below:

FRONT PAGE, Col. 2, FOREIGN PATENT DOCUMENTS
line 1, "of 0000" should be --6/69--.

Col. 1, line 26, "phosphosilicates" should be --phosphosilicate--.

Col. 3, line 2, "preferble" should be --preferable--;
line 63, "9, contact" should be --9, a contact--.

Col. 6, line 39, "metal over" should be --metal layer over--.

Signed and Sealed this

Eighteenth Day of April, 1989

Attest:

DONALD J. QUIGG

Attesting Officer     Commissioner of Patents and Trademarks